(12) United States Patent
Song et al.

(10) Patent No.: US 7,903,445 B2
(45) Date of Patent: Mar. 8, 2011

(54) PHOTONIC MEMORY DEVICE, DATA STORING METHOD USING THE PHOTONIC MEMORY DEVICE AND PHOTONIC SENSOR DEVICE

(75) Inventors: Byung-Youn Song, Gyeonggi-do (KR); Jung-Hoon Lee, Seoul (KR)

(73) Assignee: LG Electronics, Inc., Seoul (KR)

( * ) Notice: Subject to any disclaimer, the term of this patent is extended or adjusted under 35 U.S.C. 154(b) by 41 days.

(21) Appl. No.: 12/516,192

(22) PCT Filed: Dec. 18, 2006

(86) PCT No.: PCT/KR2006/005533
§ 371 (c)(1),
(2), (4) Date: May 22, 2009

(87) PCT Pub. No.: WO2008/062921
PCT Pub. Date: May 29, 2008

(65) Prior Publication Data
US 2010/0061138 A1   Mar. 11, 2010

(30) Foreign Application Priority Data
Nov. 24, 2006  (KR) .................. 10-2006-0117077

(51) Int. Cl.
*G11C 13/00* (2006.01)

(52) U.S. Cl. .................. 365/106; 365/109; 365/112
(58) Field of Classification Search .................. 365/106, 365/109, 112
See application file for complete search history.

(56) References Cited

U.S. PATENT DOCUMENTS

| 6,859,304 | B2 | 2/2005 | Miller et al. |
| 6,965,128 | B2 | 11/2005 | Holm et al. |
| 7,076,138 | B2 | 7/2006 | Rupasov et al. |
| 2006/0044862 | A1 | 3/2006 | Gilton |
| 2008/0165565 | A1* | 7/2008 | Gunter et al. ............... 365/145 |

OTHER PUBLICATIONS

Carlos Angulo Barrios and Michal Lipson, Silicon Photonic Read-Only Memory, Journal of Lightwave Technology, Jul. 2006, pp. 2898-2905, vol. 24, No. 7.

* cited by examiner

*Primary Examiner* — Huan Hoang
(74) *Attorney, Agent, or Firm* — Lee, hong, Degerman, Kang & Waimey

(57) ABSTRACT

Provided are a photonic memory device, a method of storing data using the photonic memory device, and a photonic sensor device. The photonic memory device comprises a signal line through which a photon is input; a ring resonator receiving a photon through an input gap that is adjacent to the signal line and storing the photon; and a detect line outputting the photon stored in the ring resonator through an output gap that is adjacent to the ring resonator, wherein data is read/written and stored/deleted by the input/output of the photon.

16 Claims, 6 Drawing Sheets

PHOTONIC MEMORY DEVICE, DATA STORING METHOD USING THE PHOTONIC MEMORY DEVICE AND PHOTONIC SENSOR DEVICE

CROSS-REFERENCE TO RELATED APPLICATIONS

This application is a PCT filing of International Application No. PCT/KR2006/005533, filed Dec. 18, 2006, which claims the benefits of earlier filing date and right of priority to Korean Application No. 10-2006-01177077, filed on Nov. 24, 2006, the contents of all of which are incorporated by reference herein their entirety.

TECHNICAL FIELD

The present invention relates to a memory device, a method of storing data using the memory device, and a sensor device, and more particularly, to a photonic memory device, a method of storing data using the photonic memory device, and a photonic sensor device capable of detecting external stimulus.

BACKGROUND ART

Presently, in computers or information processing devices, data is processed by moving electrons through copper wires; however, recently, photonics technology in which data is transmitted, processed, or computed using a flow of photons is being studied vigorously.

Thanks to the development of photonics technology, several new communication devices are being developed, and optical communication technology for transmitting data using light is being commercialized for general consumers to enable use of optical communication networks having a high bandwidth. Consumers can connect personal computers, servers, and other electronic appliances to an optical communication network at low cost.

An example of photonics technology is providing a waveguide on a silicon chip, and dividing the waveguide into two to separate a single optical beam into two, and then applying charges to one of the separated optical beams to induce a phase transition. When the separated optical beams are put together, the phase transition between the two optical beams is detected and thus an on/off signal at a speed of 1 GHz, that is, a speed at which data of a billion bits per second or greater can be transmitted, can be detected. By combining such photonic circuits, a logic circuit or a frequency filter can be realized. The operation speed of the photonic circuit is approximately 50 times greater than in the conventional art. Using silicon photonics technology, applications requiring higher bandwidth such as faster internet, high performance computers, super high definition displays, and image processing systems can be developed.

The reason that fiber optics is applied to silicon chips has to do with bandwidth considerations, as described above. A bandwidth of 1 GHz means that one billion bits of information can be processed per second with respect to a single optical fiber. The amount of information that will be transferred through networks is expected to increase by more than 10 times in the future. Also, even when it is a single photonic link, when multiple data channels transmitting a plurality of light having different wavelengths (or different colors) are formed, a great amount of data can be transmitted at the same time, maintaining the 1 GHz bandwidth.

An optical fiber cable is not affected by electromagnetic noise, which has been a problem in existing copper connections, has no danger of entanglement of wires, and does not generate heat either. In the case of copper wires, electrons can move a maximum of 50 cm at a speed of 10 Bbps (B=billion) due to impurities inside the copper and the irregularity of the molecular structure of copper. However, in the case of optical fiber, photons instead of electrons pass through a free space or a medium corresponding to a free space (e.g., a waveguide), and thus can move more than 10 km at a speed of maximum 150 Tbps (T=trillion). When using wavelength division multiplexing, one optical fiber can carry 40 channels, and thus can theoretically have a speed of 6 Pbps (P=Peta).

Various devices, in which a photonic circuit is integrated on a silicon chip as a super high density integrated circuit, have been developed. Examples of such devices are a frequency filter such as a notch type filter using a ring resonator, digital filters such as a FIR filter, an IR filter, etc., and logic circuits. As another example, not only the silicon chip but also copper wires of a printed circuit board are replaced with an optical fiber or optical waveguide. However, a memory device has not been developed yet.

In the case of a central processing unit (CPU), a plurality of memory devices such as a calculation processing unit performing calculations at high speed using a combination of logic circuits, a register storing the result of calculation temporarily, and a level cache memory (L2 cache) for efficient calculation are needed. However, an example of a device using silicon photonics that can be used as a memory device is only a device in which a flip-flop is formed by combining a NAND or NOR logic circuit to store 1 bit of information. A memory device that is realized by combining photonic logic circuits has a significantly large size, and thus it is very inefficient in respect of integration to manufacture a memory device storing data of only 1 bit by combining a plurality of logic circuits.

That is, when photonics technology is applied substantially, logic circuits or frequency filters can be realized as photonics circuits; however, memory devices such as register or L2 cache memory cannot be realized directly. For example, a calculation processing unit can realize a logic circuit using a photonic circuit; however, a memory unit cannot directly use a photonic circuit due to the spatial limit and thus has to use conventional DRAM or SRAM.

FIG. 1 is a plane view illustrating a structure of a conventional DRAM. A DRAM 10 includes cells distinguished by a bit line 11, and a word line 12, and a sense amp transistor 13 and a capacitor 14 included in each of the cells. Each cell stores data of 1 bit or more, wherein the amount of data depends on the structure of a chip. Each cell has a distinguished address according to the line and row, and memory is accessed using addresses. An end portion of the sense amp transistor 13 is connected to the bit line 11, and a gate of the sense amp transistor 13 is connected to the word line 12 to perform writing, reading, and refreshing of the DRAM memory 10. The capacitor 14 of each cell is discharged after one access period is terminated. The sense amp transistor 13 receives power from the bit line 11 before one access period is terminated, and refreshes the data of the DRAM 10 by charging the capacitor 14.

Technical Solution

The present invention provides a memory device, and more particularly, a photonic circuit using photons which is capable of storing data using a minimum surface area, and a method of storing data.

Advantageous Effects

According to the present invention, the present invention provides the first photonic memory device in which 1 bit of data can be stored in a minimum surface area by directly using a photonic circuit. That is, a ring resonator is arranged in cells arranged in rows and columns to store photons, and thus this structure is the same as a DRAM memory in which memory management is compatible and which is realized by a conventional CMOS circuit and can be manufactured with a high degree of integration in a small space.

According to the present invention, a maximum number of memory devices can be most efficiently arranged in a minimum surface area in a photonic high density integrated circuit based on silicon, and the maximum memory devices are expected to be in the center of the future semiconductor market and create an enormous ripple effect in the semiconductor industry since the memory management mode of the maximum memory devices is almost the same as that of a conventional DRAM. In addition, according to the present invention, the photonic memory device can be used both as a memory device and a photonic sensor device having high sensitivity if it is applied to an optical signal processing circuit, since the resonance frequency of the ring resonator reacts to external stimulus.

MODE OF THE INVENTION

The present invention will now be described more fully with reference to the accompanying drawings, in which exemplary embodiments of the invention are shown. However, the invention is not limited to the drawings and may be embodied in many different forms.

Figure 1:
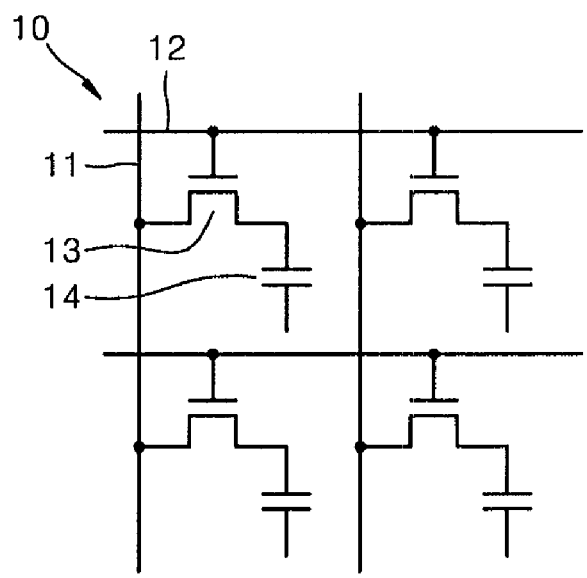
FIG. 1 is a plane view illustrating a conventional DRAM.
Figure 2:
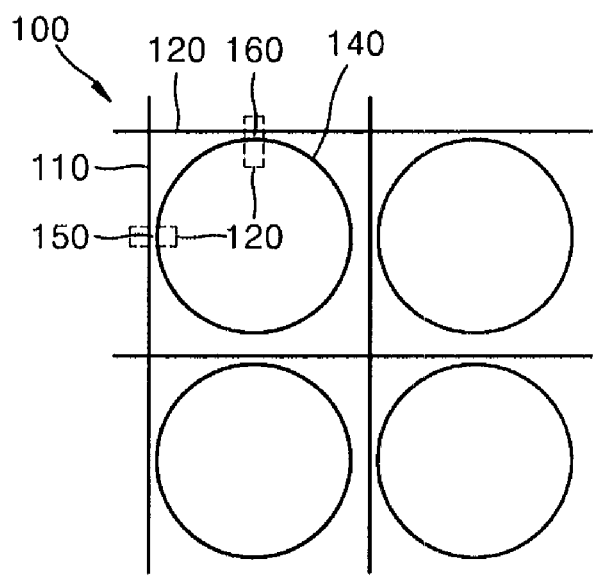
FIG. 2 is a plane view illustrating a structure of a photonic memory device according to an embodiment of the present invention.

FIG. 2 is a plane view illustrating a structure of a photonic memory device 100 according to an embodiment of the present invention. Like a DRAM 10 of FIG. 1 using a bit line 11 and a word line 12, the memory device 100 also uses a bit line and a word line. The bit line 11 of FIG. 1 corresponds to a signal line 110 and the word line 12 of FIG. 1 corresponds to a detect line 120 in FIG. 2. The sense amp transistor 13 of FIG. 1 corresponds to a switching device 200 shown in FIG. 5, and the capacitor 14 of FIG. 1 corresponds to a ring resonator 140 in FIG. 2. Electrons are transferred through the bit line 11 and the word line 12 in FIG. 1, while in contrast, photons are transferred through the signal line 110 and the detect line 120 in the present embodiment of the present invention. The signal line 110, the detect line 120, and the ring resonator 140 are formed using an optical fiber or an optical waveguide, and are stacked as thin layers through an MEMS process to form a highly integrated chip.

Figure 3A:
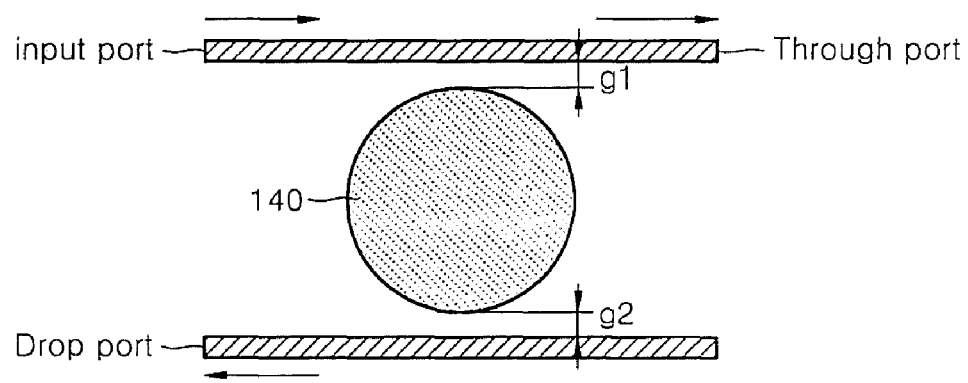
FIGS. 3A and 3B illustrate fundamental operation principles of a ring resonator according to an embodiment of the present invention.
Figure 3B:
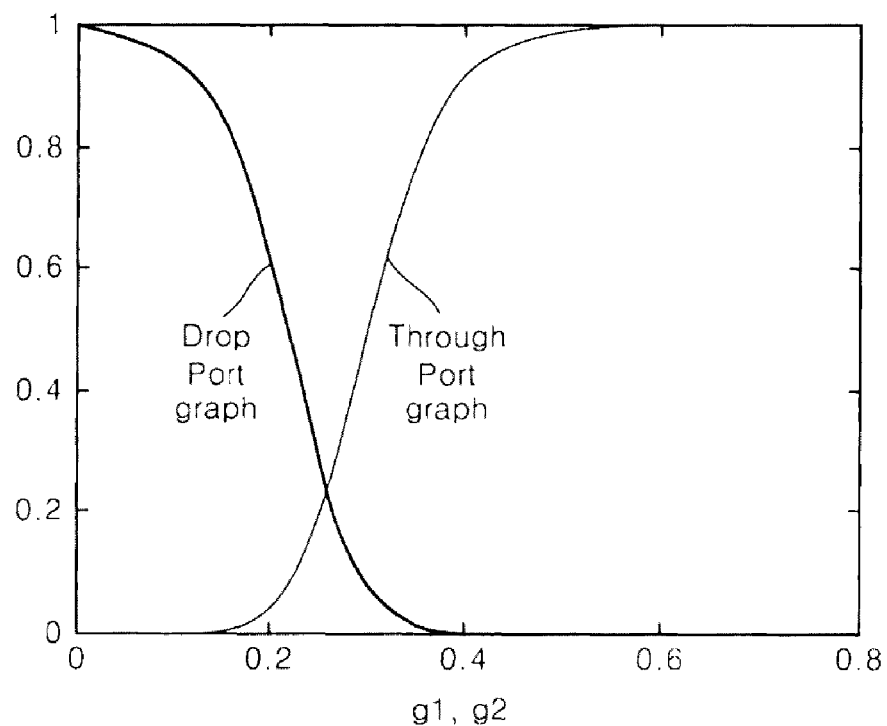

FIGS. 3A and 3B illustrate fundamental operation principles of a ring resonator according to an embodiment of the present invention. Referring to FIGS. 3A and 3B, when light is input from an input port at an upper left side of an input line as illustrated in FIG. 3A, the light passes through a through port or is transmitted to the ring resonator 140 by a tunneling effect due to a gap g1 between the input line and the ring resonator 140. The ring resonator 140 is formed in a ring form or a disk form. Photons transferred in this manner are stored in the ring resonator 140 according to the size of a gap g2 between the detect line 120 and the ring resonator 140, or are transferred to a drop port of the detect line 120 by a tunneling effect and come out through the drop port.

Referring to FIG. 3B, the horizontal axis denotes the size of the gap g1 and the gap g2 in a unit of μm, and the vertical axis denotes the frequency of photons. For example, with reference to the curve denoted as a through port graph, when g1 is smaller than 0.2 μm, photons are all transferred to the ring resonator 140 by a tunneling effect; when g1 is greater than 0.2 μm, photons leak out to the through port. When g1 is significantly greater than 0.4 μm, no tunneling effect is generated, thus all photons are transferred to the through port and the frequency of the photons in the through port is almost 1. Likewise, with reference to the curve denoted as a drop port graph, the smaller the gap g2, the more photons stored in the ring resonator 140 leak out to the drop port, and thus the frequency of the photons in the drop port becomes almost 1. According to experiment conditions, the size of g1 at which photons leak out to the through port (0.2 μm as illustrated) and the size of g1 (0.4 μm as illustrated) at which the tunneling effect is greatly reduced can be varied. This is the same case for g2.

Figure 4:
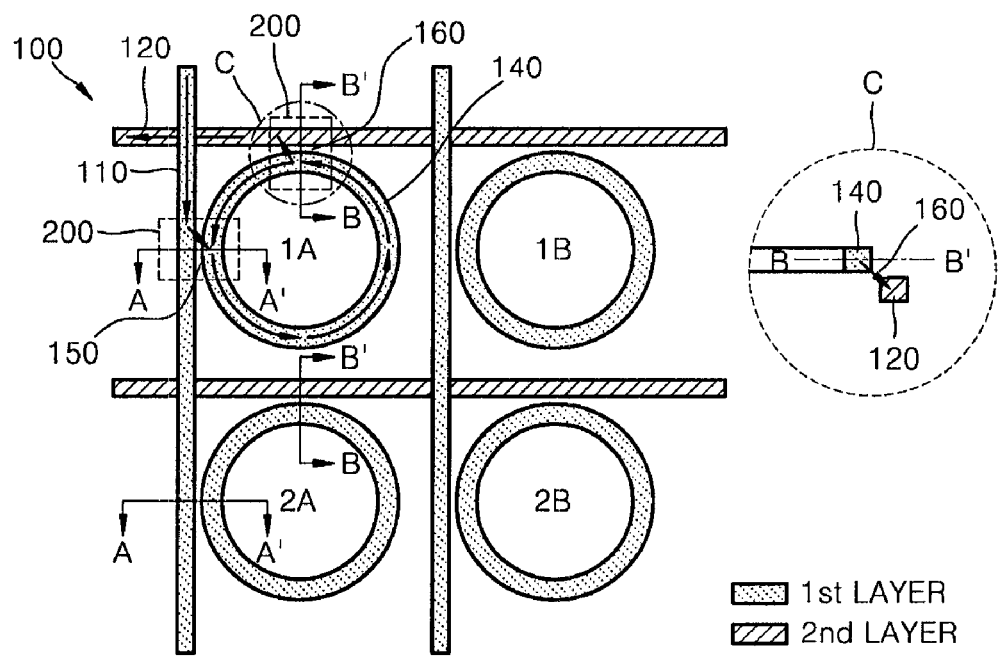
FIGS. 4 through 6 illustrate reading and writing of data according to the movement of photons according to an embodiment of the present invention.
Figure 5:
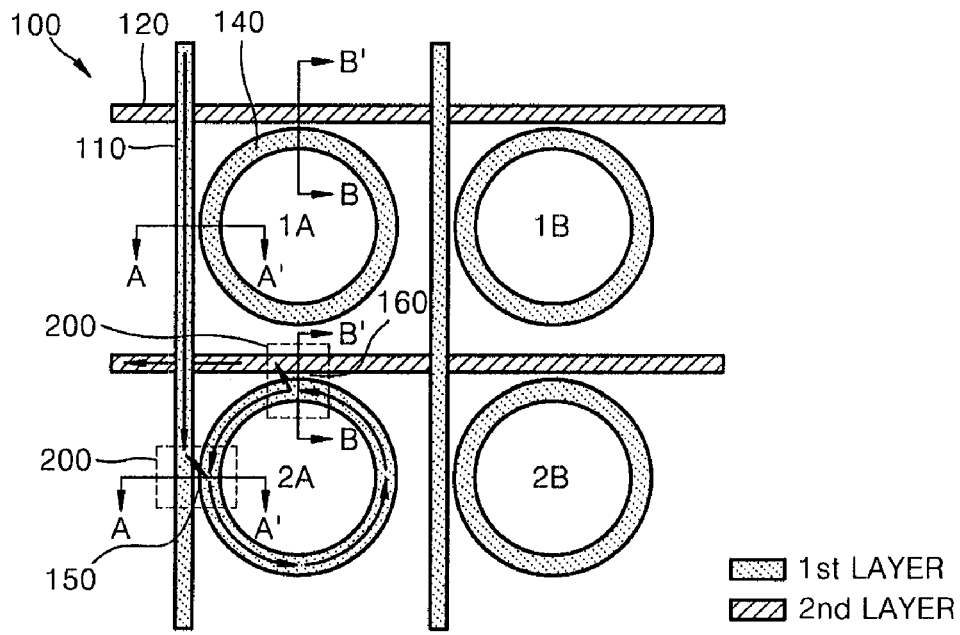
Figure 6:
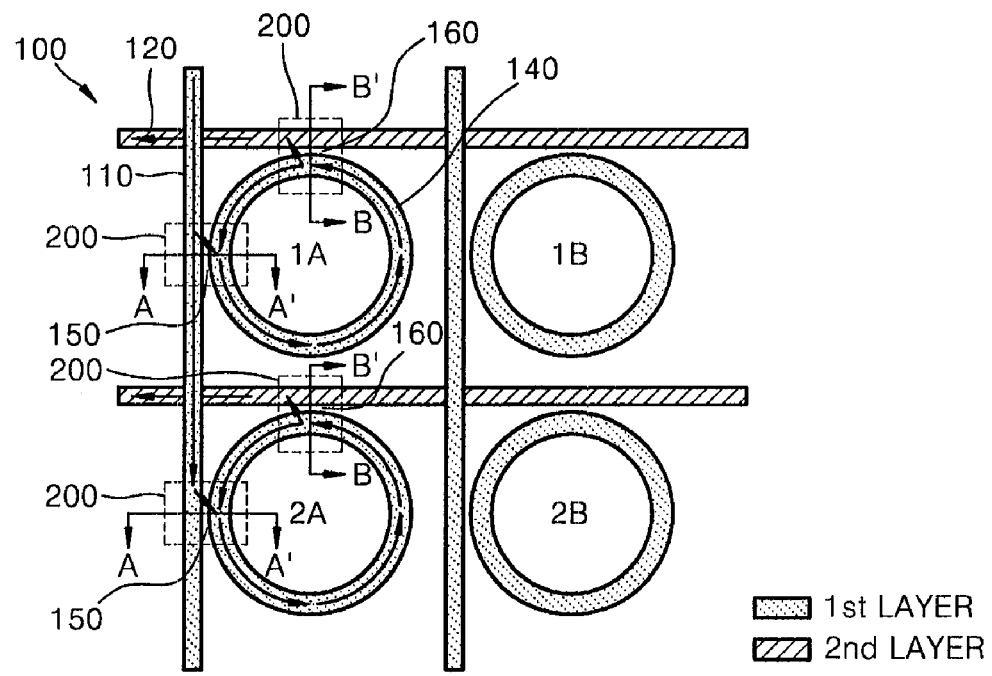

Using the ring resonator 140 and the tunneling effect, a memory device 100 in a matrix is formed, which is illustrated in FIGS. 4 through 6. Here, the flow of photons is denoted with arrows. For convenience, a cell in an upper, left section is called 1A, a cell in an upper, right section is called 1B, a cell in a lower, left section is called 2A, and a cell in a lower, right section is called 2B. The signal line 110 and the detect line 120 extend perpendicularly to each other, and the ring resonator 140 may be formed in the cell between the signal line 110 and the detect line 120. The signal line 110 through which photons are input cannot cross the detect line 120 through which photons are output. Thus the signal line 110 and the detect line 120 should be in skew position. In other words, a plurality of cells may be arranged in different layers in a vertical is direction. For example, in an MEMS structure of the memory device 100, the signal line 110 and the ring resonator 140 may be formed in the same layer (a first layer indicated with dots in FIG. 4), and the detect line 120 may be formed in a different layer from the above layer (a second layer indicated with hatching in FIG. 4). A cell stores data of 1 bit, and when a plurality of cells are provided and these cells are sequentially accessed, data of 1 bit or more can be processed.

First, referring to FIG. 4, data of 1 bit is stored in a cell 1A according to an embodiment of the present invention. Photons are input to the signal line 110, and then when an input gap 150 between the signal line 110 and the ring resonator 140 is equal to or smaller than a predetermined value illustrated in FIG. 3B, photons are input to the ring resonator 140. Writing of data is performed in this way.

The photons input in this manner repeatedly rotate inside the ring resonator 140 and are lost at a predetermined loss rate. The loss rate depends greatly on the material and form of the ring resonator 140 which is formed as an optical fiber or an optical waveguide. Also, light confined in the ring resonator 140 may leak out to the detect line 120 due to the tunneling effect. For example, with respect to the input gap 150, a state in which photons can move through the input gap 150 is defined as a positive state, and a state in which photons cannot move through the input gap 150 is defined as a negative state. When the size of an output gap 160 formed between the ring resonator 140 and the detect line 120 is equal to or smaller than a predetermined value (corresponding to the positive state), a tunneling effect is generated and thus photons leak out to the detect line 120, and by detecting the leakage of the photons, it can be found out whether the photons are stored in the ring resonator 140 or not. Reading of data is performed in this way, to determine the data stored in the ring resonator 140. When the presence of photons in the ring resonator 140 is detected, this indicates that data is recorded and the memory device 100 represents data "1".

When the output gap 160 is formed to have a value equal to or smaller than a predetermined value by changing the physical state of the detect line 120 next to the ring resonator 140, photons stored in the ring resonator 140 leak out to the detect line 120. This means erasing of data. The memory device 100 represents data "0", indicating that data is deleted by the going out of photons of the ring resonator 140. Thus the memory device 100 capable of storing, reading, and erasing data of 1 bit to the cell 1A in FIG. 3 has been described.

In order to store 1 bit in the cell 1A, photons are confined in the ring resonator 140 and the confined photons are detected by the detect line 120 by reducing the input gap 150 to be equal to or smaller than a predetermined value by applying mechanical, thermal, or electromagnetic stimulus to a cross-section A-A' or by changing the resonance frequency of the ring resonator 140. The cross-section A-A' of FIG. 4 shows that when the input gap 150 is equal to or smaller than a predetermined value (corresponding to the positive state), photons (movements of the portions are indicated with an arrow) are transferred to the ring resonator 140 due to the tunneling effect. A cross-section B-B' shows that when the output gap 160 between the ring resonator 140 of the first layer and the detect line 120 of the second layer is designed to be equal to or smaller than a predetermined value, the presence of stored photons can be determined using the tunneling effect.

Unlike the above illustrated embodiment, a switching device 200 capable of actively adjusting the size of the output gap 160 can be provided. That is, when a switching device 200 is further formed at the output gap 160 and not only at the input gap 150, a positive state, in which photons can be output can be formed by reducing the size of the output gap 160, or a negative state, in which photons cannot be output can be formed by increasing the size of the output gap 160.

As can be inferred from the description with reference to FIG. 3B, when the output gap 160 is smaller than the input gap 150, the amount of photons input to the ring resonator 140 is greater than that of photons output from the ring resonator 140, and thus recorded data may be lost. Accordingly, the output gap 160 should be greater than the input gap 150, and the output gap 160 may be greater than the input gap 150 particularly when the input gap 150 is in the positive state. For example, referring to FIG. 3B, the output gap 160 may have a value of 0.4 μm or thereabouts such that the value lies in a section where the inclination of the drop port graph ends, thereby controlling the leakage of photons to be as little as possible.

Data of 1 bit is stored in a cell 2A as illustrated in FIG. 5. The input gap 150 of the cell 1A is controlled by the switching device 200 such that a negative state in which photons cannot be input is generated, and the input gap 150 of the cell 2A is controlled by the switching device 200 such that a positive state in which photons can be input is generated. Thus data of 1 bit is stored in the cell 2A.

1 bit of data is stored in the cell 1A and in the cell 2A simultaneously or sequentially as illustrated in FIG. 6. When the input gap 150 of the cell 1A and the input gap 150 of the cell 2A are simultaneously or sequentially stimulated by the switching device 200, photons are confined simultaneously or sequentially in the cell 1A and in the cell 2A. Thus 2 bits of data can be stored. Likewise, when a plurality of cells are arranged in a direction of a two-dimensional plane or in a three-dimensional space, a large capacity storage device can be realized.

With respect to the switching device 200, the switching device 200 controls the input/output of photons by controlling at least one of the size of the input gap 150, the size of the output gap 160, the size of an electromagnetic field E applied to the input gap 150, the size of an electromagnetic field E applied to the output gap 160, and the resonance frequency of the ring resonator 140. As the input gap 150 is reduced by the switching device 200, the input gap 150 can be converted into a positive state, or as the input gap 150 is increased by the switching device 200, the input gap 150 can be converted into a negative state. Alternatively, the resonance frequency of the ring resonator 140 is changed by the switching device 200 to convert the input gap 150 into a positive state or a negative state.

Although not illustrated in the drawings, the input gap 150 can be converted into a positive state or a negative state without the switching device 200 by changing the resonance frequency of the ring resonator 140. That is, the resonance frequency of the ring resonator 140 may be changed due to the interaction of photons passing through the signal line 110 or the detect line 120 and photons accumulated in the ring resonator 140, and using this change, the input gap 150 may be converted into a positive or a negative state.

Figure 7A:
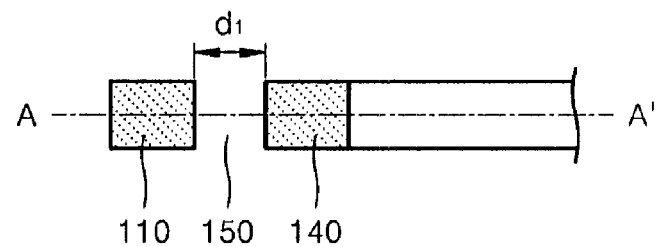
FIGS. 7A and 7B are side cross-sectional views cut along the line A-A', illustrating movement of photons by deformation of an input gap which is bent.
Figure 7B:
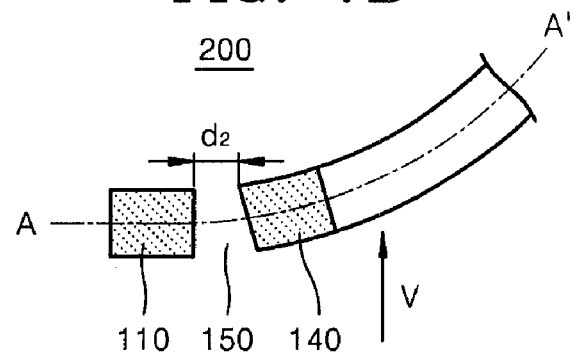

FIGS. 7A and 7B are side cross-sectional views along a cross-sectional A-A', illustrating movement of photons by deformation of an input gap 150 that is bent. When a shearing force V is applied to the first layer in which the signal line 110 and the ring resonator 140 are formed, the input gap 150 is bent such that the input gap 150, which has a size d1 initially, is reduced to a size d2, thereby generating a tunneling effect. Photons move in a direction indicated by the arrow. The input gap 150 is not limited as illustrated in the drawing and may be narrowed or widened according to the position of the applied shearing force V. For example, when the shearing force V is applied to the center of the signal line 110 and the resonator 140, the input gap 150 may be widened according to the supporting condition. Accordingly, the input gap 150 may be in a positive or negative state when the shearing force V is applied, and the switching device 200 applies the shearing force V to bend the input gap 150 to control the size of the input gap 150. When the shearing force V is controlled to be applied in a more horizontal direction, the resonance frequency of the ring resonator 140 is changed and thereby the input gap 150 is converted into a negative or positive state.

That is, one of the size of the input gap 150, the size of the output gap 160, the size of an electromagnetic field E applied to the input gap 150, the size of an electromagnetic field E applied to the output gap 160, and the resonance frequency of the ring resonator 140 may be controlled alone or at least two of these parameters can be controlled at the same time.

Figure 8A:
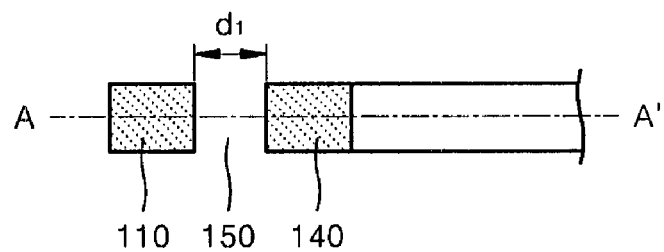
FIGS. 8A and 8B are side cross-sectional views cut along a cross-section A-A', illustrating movement of photons by deformation of an input gap by a compressive force.
Figure 8B:
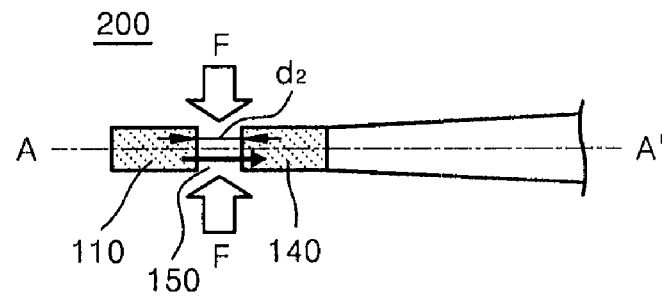

FIGS. 8A and 8B illustrate a switching device 200 controlling the size of the input gap 150 by deforming the input gap 150 with a compressive force. That is, when the input gap 150 between the signal line 110 and the ring resonator 140 has a size d1 initially and is in a negative state, and a compressive force F is applied onto and under the input gap 150, compression deformation is generated in a parallel direction of the force F and tension deformation is generated in a vertical direction of the force F, thereby reducing the input gap 150 to a size d2 and converting the input gap 150 into a positive state. At this point, photons move to the ring resonator 140 as indicated by the arrow due to the tunneling effect of the input gap 150. Though not illustrated in the drawing, the input gap 150 may be converted into a positive state by applying tension force.

Figure 9A:
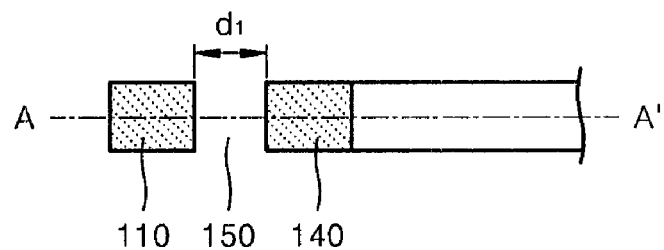
FIGS. 9A and 9B are side cross-sectional views cut along a cross-section A-A', illustrating movement of photons by thermal deformation of an input gap.
Figure 9B:
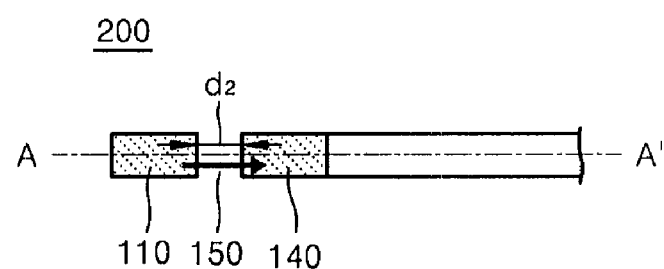

FIGS. 9A and 9B illustrate a switching device 200 controlling the size of the input gap 150 by thermally deforming the input gap 150 instead of using mechanical stimulus. That is, a heat generation unit (not shown) is provided to apply heat directly to the signal line 110 and the ring resonator 140 around the input gap 150 to thermally expand the input gap 150 to convert the input gap 150, which has a size d1 initially, to have a size d2 in a positive state. Photons move in the direction indicated by the arrow.

Figure 10A:
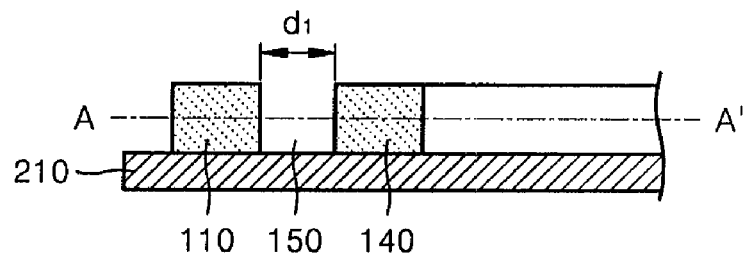
FIGS. 10A and 10B are side cross-sectional views illustrating a bimetal formed in the input gap.
Figure 10B:
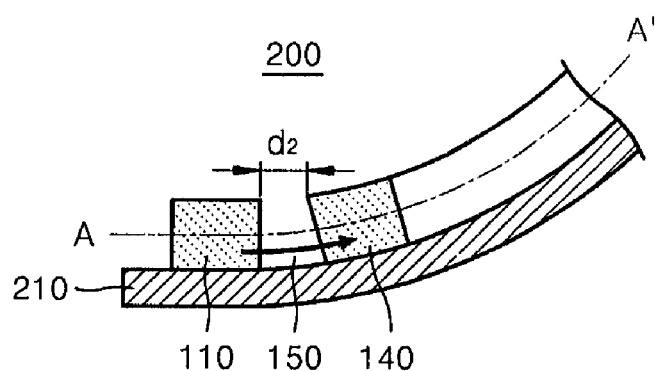

FIGS. 10A and 10B illustrate a switching device 200 employing a bimetal 200 that is bent only in one direction when heat is generated by using materials having different thermal expansion coefficients. Photons move in the direction indicated by the arrow. When the bimetal 210 is heated, the input gap 150 having a size d1 initially is deformed to have a reduced size d2 and is converted into a positive state. Photons move in the direction indicated by the arrow.

Figure 11:
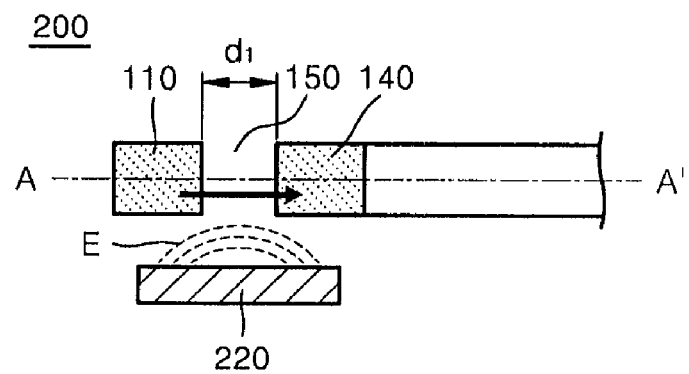
FIG. 11 is a side cross-sectional view cut along a cross-section A-A', illustrating movement of photons by an electromagnetic field applied to the input gap.

FIG. 11 illustrates a switching device 200 converting the input gap 150 into a positive state by changing the resonance frequency of the ring resonator 140. The resonance frequency of the ring resonator 140 is known to be very sensitive to small changes such as a small change in radius. Using such a characteristic, when a metal plate 220 applying electromagnetic field E is installed near the input gap 150, electromagnetic field E is generated when power is applied to the metal plate 220 to change the resonance frequency of the ring resonator 140 and thus the input gap 150 maintains its size and is converted into a positive state. Photons move in the direction indicated by the arrow.

The photonic memory device 100 can also be used as a photonic sensor device (not shown) by using the sensitivity of the resonance frequency of the ring resonator 140 to external stimulus. The resonance frequency of the ring resonator 140, and of course the size of the input gap 150, the size of the output gap 160, the size of an electromagnetic field E applied to the input gap 150, the size of an electromagnetic field E applied to the output gap 160, and the resonance frequency of the ring resonator 140 can be changed by the external stimulus. Thus the external stimulus can be recognized by detecting a change in states of the input/output of the photons.

While the switching device 200 of the photonic memory device 100 has an active function of controlling the input/output of photons according to external stimulus, the switching device 200 of the photonic sensor device having the same structure of that of the photonic memory device 100 has a passive function of sensing external stimulus by detecting the input/output of the photons.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A photonic memory device comprising:
   a signal line through which a photon is input;
   a ring resonator receiving the photon through an input gap that is adjacent to the signal line and storing the photon; and
   a detect line outputting the photon stored in the ring resonator through an output gap that is adjacent to the ring resonator, wherein data is read/written and stored/deleted by the input/output of the photon.

2. The photonic memory device of claim 1, wherein the signal line, the ring resonator, and the detect line are formed using an optical fiber or an optical waveguide.

3. The photonic memory device of claim 2, further comprising a switching device adjusting at least one of the size of the input gap, the size of the output gap, the magnitude of an electromagnetic field applied to the input gap, the magnitude of an electromagnetic field applied to the output gap, and the resonance frequency of the ring resonator,
   wherein the input/output of the photon is adjusted by the switching device.

4. The photonic memory device of claim 3, wherein the switching device adjusts the size of the input gap or the size of the output gap by bending deformation of the input gap or the output gap by applying shearing force.

5. The photonic memory device of claim 3, wherein the switching device adjusts the size of the input gap or the size of the output gap by compressive deformation/tensile deformation of the input gap or the output gap by applying compressive force/tension force.

6. The photonic memory device of claim 3, wherein the switching device adjusts the size of the input gap or the size of the output gap by thermal deformation of the input gap or the output gap.

7. The photonic memory device of claim 6, wherein the switching device comprises a bimetal for generating the thermal deformation.

8. The photonic memory device of claim 3, wherein the switching device comprises a metal plate to which power is applied for forming an electromagnetic field in the input gap or the output gap.

9. The photonic memory device of claim 3, wherein the switching device adjusts the resonance frequency of the ring resonator by adjusting the radius of the ring resonator.

10. The photonic memory device of claim 1, wherein the signal line and the ring resonator are formed in the same layer, and the detect line is formed in a different layer, and the photonic memory device is formed of an MEMS structure.

11. The photonic memory device of claim 1, wherein the signal line and the detect line are extended perpendicularly to each other, and the ring resonator is arranged in cells formed between the signal line and the detect line.

12. The photonic memory device of claim 11, wherein each cell stores 1 bit of data, and 1 bit or more of data can be simultaneously or sequentially accessed by a plurality of cells.

13. The photonic memory device of claim 12, wherein the cells are arranged in a vertical direction in different layers to one another.

14. The photonic memory device of claim 1, wherein the output gap is greater than the input gap.

15. A photonic sensor device comprising:
   a signal line through which a photon is input;
   a ring resonator receiving the photon through an input gap that is adjacent to the signal line and storing the photon; and
   a detect line outputting the photon stored in the ring resonator through the output gap that is adjacent to the ring resonator,
   wherein when external stimulus is applied, the external stimulus is recognized by detecting the change of the input/output of the photon.

16. The photonic sensor device of claim 15, further comprising a switching device changing at least one of the size of the input gap, the size of the output gap, the magnitude of an electromagnetic field applied to the input gap, the magnitude of an electromagnetic field applied to the output gap, and the resonance frequency of the ring resonator,
   wherein the input/output of the photon is changed by the switching device according to the external stimulus.

* * * * *

UNITED STATES PATENT AND TRADEMARK OFFICE
CERTIFICATE OF CORRECTION

| | | |
|---|---|---|
| PATENT NO. | : 7,903,445 B2 | Page 1 of 1 |
| APPLICATION NO. | : 12/516192 | |
| DATED | : March 8, 2011 | |
| INVENTOR(S) | : Byung-Youn Song and Jung-Hoon Lee | |

It is certified that error appears in the above-identified patent and that said Letters Patent is hereby corrected as shown below:

In the cover page section (73) should be as follows:

(73) Assignee: Seoul National University Industry Foundation, Seoul (KR)

Signed and Sealed this
Twelfth Day of July, 2011

David J. Kappos
*Director of the United States Patent and Trademark Office*